United States Patent [19]

Young

[11] Patent Number: 4,642,568

[45] Date of Patent: Feb. 10, 1987

[54] NUCLEAR MAGNETIC RESONANCE METHODS AND APPARATUS

[75] Inventor: Ian R. Young, Sunbury-on-Thames, England

[73] Assignee: Picker International Limited, Wembley, England

[21] Appl. No.: 673,190

[22] Filed: Nov. 19, 1984

[30] Foreign Application Priority Data

Nov. 25, 1983 [GB] United Kingdom ................ 8331501

[51] Int. Cl.$^4$ ............................................ G01R 33/20
[52] U.S. Cl. .................... 324/309; 324/307
[58] Field of Search ............ 324/300, 307, 309, 311, 324/312, 313, 314, 318, 322

[56] References Cited

U.S. PATENT DOCUMENTS 3,789,832  2/1974  Damadian .......................... 324/309
4,449,097  5/1984  Young ................................. 324/318

FOREIGN PATENT DOCUMENTS 2056082A   7/1980  United Kingdom .
2056087   11/1980  United Kingdom .
2082775    3/1982  United Kingdom .
2105853A   6/1982  United Kingdom .
2137757A   3/1984  United Kingdom .
2141236A   5/1984  United Kingdom .

OTHER PUBLICATIONS

Hoult, D. I., "Rotating Frame Zeugmatography", Journal of Magnetic Resonance 33, 183–197 (1979).

Primary Examiner—Michael J. Tokar
Attorney, Agent, or Firm—Watts, Hoffmann, Fisher & Heinke Co.

[57] ABSTRACT

An NMR imaging method and apparatus wherein spatial encoding of spins is effected by applying a radio frequency field (B2) having a gradient, thereby avoiding the eddy current problems which can arise with d.c. gradient magnetic pulses conventionally used for spatially encoding spins.

7 Claims, 2 Drawing Figures

NUCLEAR MAGNETIC RESONANCE METHODS AND APPARATUS

This invention relates to methods and apparatus for investigating the distribution of a quantity in a selected region of a body using nuclear magnetic resonance (NMR) techniques.

NMR techniques have been used for the qualitative analysis of materials for many years. More recently NMR techniques have been used to investigate the distribution, more especially the spatial distribution, in a selected region of a body of a chosen quantity e.g. the density of chosen nuclei, for example, hydrogen protons, or NMR spin relaxation time constants. Such spatial distributions are similar to, although of different significance from, the distributions of X-ray attenuation provided by computerised tomography systems, and have thus found especial application in medical examination of patients.

Such NMR techniques for investigating distributions are hereinafter, for convenience, referred to as NMR imaging techniques, although it will be appreciated that the data obtained is not necessarily presented in the form of an image, and on occasion may be presented in alternative e.g. tabular form.

A known NMR imaging technique comprises preferentially exciting nuclear magnetic spins in a selected region of a body e.g. a slice of the body, applying a magnetic gradient in at least one direction across the selected region e.g. in the plane of the selected slice, and detecting and processing signals representative of the resulting spins in the region to retrieve the required data.

The purpose of the magnetic gradient is to frequency and/or phase encode the signals from different parts of the region thereby to spatially encode the signals and so enable signals from different parts of the region to be separately identified.

In one particular such technique two encoding gradients are used, one a steady gradient applied throughout the period which resonance signals are detected, and the other a gradient pulse applied before the read out period but, of course, after excitation of resonance. To obtain a sufficient set of data for imaging, the sequence is repeated a number of times with a different value for the gradient pulse each time.

In a modified form of such a technique two pulsed gradients, or if a three-dimensional region is being imaged, three pulsed gradients and no steady gradient may be used.

One difficulty which can arise with such techniques is that the magnetic fields used to apply the pulsed gradients give rise to eddy currents, for example, in metal objects in the vicinity of the NMR apparatus or even in the ground under the apparatus. Such eddy currents in turn can give rise to magnetic fields which create artefacts in the image obtained.

It is an object of the present invention to provide a method and apparatus for NMR imaging wherein this difficulty is alleviated.

According to the present invention in a method of investigating the spatial distribution of a quantity in a selected region of a body using NMR techniques, spatial encoding of nuclear magnetic spins in said selected region is effected at least partly by applying to said region a radio frequency magnetic field having a gradient across said region.

Preferably nuclear magnetic spins are first excited in said region and subsequently said spins are spatially encoded by applying said radio frequency field having a gradient.

In one particular method in accordance with the invention said radio frequency field is applied during application to said body of a further magnetic field gradient such that said radio frequency field is effective to encode nuclear magnetic spins preferentially in a selected region of said body.

In one such method said further magnetic field gradient also serves to rephase spins produced in said region by previous application to said body of a magnetic field gradient in the reverse direction to said further gradient together with a radio frequency magnetic field so as to excite nuclear magnetic spins preferentially in said region.

According to a second aspect of the invention there is provided an apparatus for investigating the spatial distribution of a quantity in a selected region of a body using NMR techniques comprising: means arranged to excite nuclear magnetic spins in a selected region of a body; means arranged to apply to said region a radio frequency magnetic field having a gradient across said region, thereby to spatially encode the spins occurring in said region; detector means arranged to produce signals representative of the spins occurring in said region; and processing means arranged to retrieve data from the signals detected by said detector means.

One method and apparatus in accordance with the invention will now be described, by way of example, with reference to the accompanying drawings in which.

Figure 1:
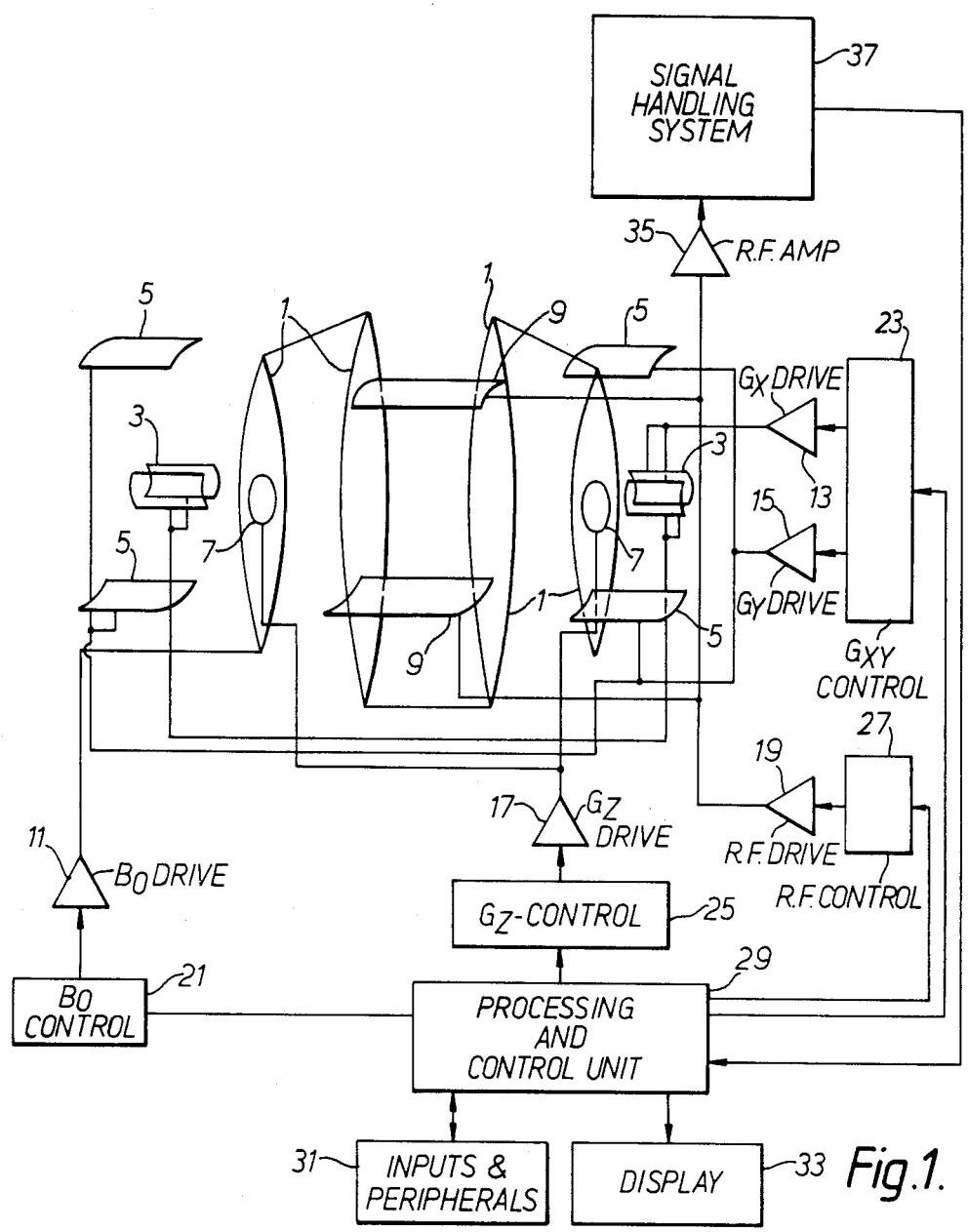
FIG. 1 illustrates the apparatus diagrammatically.

The apparatus of FIG. 1 includes a first coil system whereby a magnetic field can be applied to a body to be examined in a given direction, hereafter designated the Z-direction, with a gradient in any one or more of the three orthogonal directions i.e. X, Y and Z directions.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system 9 whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

In the drawing a single pair of coils 9 is shown for both applying and detecting RF fields, but in practice it is usually preferable to provide separate coils for detecting the RF fields.

The various coils 1, 3, 5, 7 and 9 are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits (not shown) which receive signals from field probes (not shown) which are disposed at suitable positions in relation to the body being examined to monitor the applied fields.

Figure 2:
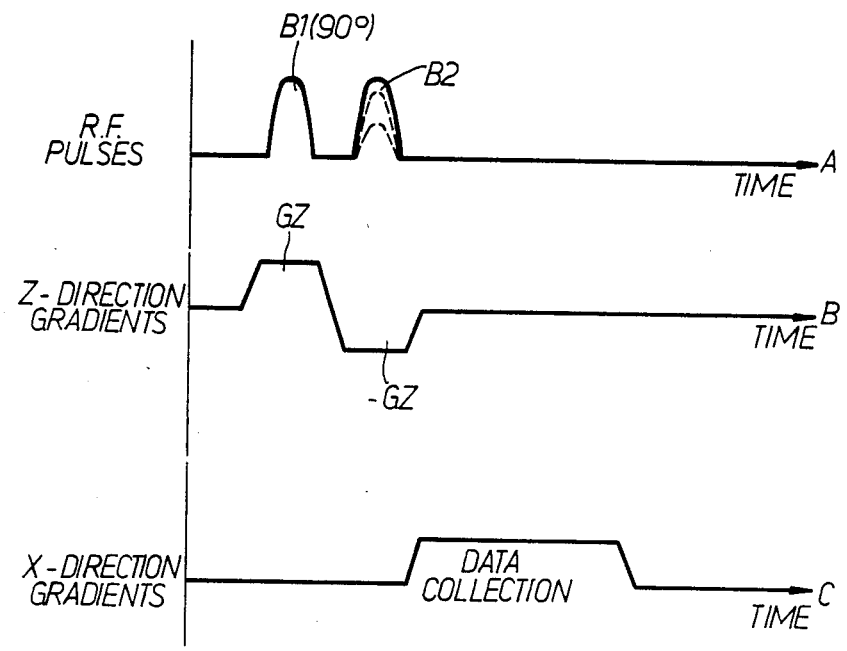
FIG. 2 illustrates the sequence of steps involved in the method.

A method of operating the apparatus of FIG. 1 in accordance with the invention so as to obtain an image indicating the distribution of a quantity in a selected slice of a body will now be described with reference to FIG. 2.

The body is first positioned in the apparatus in the region to which the field Bo is applied.

A steady magnetic field Bo is then applied in the Z-direction by means of coils 1, this field serving to define an equilibrium axis of magnetic alignment in the body being examined, i.e. along the Z-direction, and remaining constant throughout the examination procedure.

A magnetic field gradient Gz along the Z-direction is then applied (see FIG. 2B) by means of coils 7, together with a radio frequency (RF) magnetic field pulse denoted B1 (90°) for reasons explained hereafter (see FIG. 2A). The frequency of the RF field is chosen to be at the Larmor frequency of chosen nuclei, typically hydrogen protons, in a slice of the body to be examined, normal to the Z-direction. The slice is defined by a particular value of magnetic field along the Z-direction such that nuclei within the slice are preferentially excited. The integral of the RF pulse is such that the pulse is just sufficient to tip the spins of the excited nuclei into the X-Y plane, and is thus referred to as a 90° pulse, the spins then precessing in the X-Y plane around the Z-axis. The pulse B1 (90°) is applied by driving both coils 9 in the same phase so that the resulting RF magnetic field is of substantially constant strength across the body, although pulsating at radio frequency.

The field gradient Gz is then removed and replaced by a gradient in the opposite sense —Gz (see FIG. 2B). This causes rephasing of the spins in the selected slice against dephasing resulting from the gradient across the slice during excitation, the —Gz pulse being shaped so that the spins are just rephased at the time the —Gz pulse is terminated.

During application of the —Gz gradient a second RF magnetic field pulse B2 at the Larmor frequency of the chosen nuclei is applied (see FIG. 2A). The B2 pulse is applied by driving the two coils 9 in opposite phases so that the resulting Y-direction magnetic field exhibits a gradient in the plane of the selected slice in the direction of the field. Thus the second magnetic field has a zero value along a line extending substantially centrally across the selected slice, and along lines parallel to the central line oscillates at radio frequency between equal and opposite peak values which increase with the spacing of the line from the central line, the oscillations being of opposite phase on opposite sides of the central line. The frequency of the pulse B2 is of course the Larmor frequency for the chosen nuclei in the mean Z-direction field in the slice.

As a result of the applied —Gz and B2 pulses the spins in the selected slice on one side of the central line in the slice are tipped back from 90° towards the Z-direction and on the other side of the central line are tipped beyond 90° towards the Z-direction, thus imposing a spatial encoding on the spins in the slice in the direction of the RF field gradient.

It will be appreciated that the —Gz pulse, in addition to effecting rephasing, also causes the radio frequency pulse B2 to be effective to encode nuclear magnetic spins preferentially in the selected slice, in a corresponding manner to the preferential excitation effected by pulse B1 in the presence of the Gz gradient.

After the B2 pulse the spins occurring in the slice are detected by the coils 9 in the presence of a further magnetic field gradient Gx (see FIG. 2C) applied by means of coils 3. The resulting signals are fed to the unit 29 for processing to obtain data for presentation of an image on the display 33. It will be appreciated that the Gx gradient serves to impose an X-direction frequency dispersion on the detected signals so as to further assist in identifying signals arising from different parts of the slice.

To obtain a full set of data for construction of an image using the well known two dimensional Fourier Transform (2DFT) image construction technique, the above sequence is repeated a number of times with a different value of the B2 encoding pulse each time.

It will be understood that the B2 encoding pulse does not give rise to significant eddy currents by virtue of the fact that adjacent objects consist of material which presents a high impedance to currents at the frequency of the B2 pulse.

In a modification of the above described procedure, two pairs of coils for applying RF magnetic fields are provided with their axes orthogonal so as to allow spatial encoding to be done in two orthogonal directions in the selected slice, the Gx gradient during read out then not being required.

It will be appreciated that in alternative embodiments of the invention where the region being imaged is a volume rather than a planar slice, RF pulses with gradients in three orthogonal directions may be used.

It will be understood that whilst in the method and apparatus described above by way of example the encoding RF gradient pulse B2 is applied during a slice selection gradient —Gz which also serves as a rephasing pusle, in other embodiments of the invention an encoding RF gradient pulse may be applied during a gradient which serves only as a slice selection gradient and does not perform a rephasing function.

It will be further understood that whilst RF magnetic field pulses with gradients in accordance with the invention may also be used in NMR imaging methods and apparatus using image construction techniques other than the 2DFT technique, a particular advantage of the present invention lies in using RF magnetic field pulses with gradients instead of the d.c. gradient pulses conventionally used in 2DFT image construction, thereby avoiding the above-mentioned eddy current problems.

It will also be understood that whilst in the method and apparatus described above by way of example excitation of spins and spatial encoding of spins are effected at different times, in other methods and apparatus in accordance with the invention excitation and spatial encoding may be effected simultaneously.

I claim:

1. A method of investigating the spatial distribution of a quantity in a selected region of a body by the use of nuclear resonance techniques, said method comprising the steps of:
   (a) exciting nuclear magnetic spins in said region, and
   (b) subsequent to said exciting step, spatially encoding said nuclear spins in said selected region at least partially by applying to said region a radio frequency magnetic field having a gradient across said region.

2. A method according to claim 1 wherein said radio frequency field is applied during application to said body of a further magnetic field gradient such that said radio frequency field is effective to encode nuclear magnetic spins preferentially in a selected region of said body.

3. A method according to claim 1 wherein said further magnetic field gradient also serves to rephase spins produced in said region by previous application to said body of a magnetic field gradient in the reverse direction to said further gradient together with a radio frequency magnetic field so as to excite nuclear magnetic spins preferentially in said region.

4. A method according to claim 1 wherein more than one said radio frequency field having a gradient across said region is applied to encode said spins, each said radio frequency field having a gradient in a different direction.

5. A method according to claim 1 comprising the steps of: (1) exciting spatially encoded nuclear magnetic spins in said selected region; (2) detecting signals representative of said spins; and (3) processing said detected spins to retrieve data; steps (1) and (2) being repeated a number of times with a different value for the gradient of the or one said radio frequency magnetic field each time.

6. An apparatus for investigating the spatial distribution of a quantity in a selected region of a body by the employment of nuclear magnetic resonance techniques, said apparatus comprising:
   (a) means arranged to excite nuclear magnetic spins in a selected region of a body;
   (b) means for spatially encoding nuclear magnetic spins occurring in said region subsequent to excitation, said means being arranged to apply to said region a radio frequency magnetic field having a gradient across said region;
   (c) detector means arranged to produce signals representing the spins occurring in said region, and
   (d) processing means to provide information from the detected signals.

7. An apparatus according to claim 6 wherein said means arranged to apply to said region a radio frequency magnetic field comprises two coils positioned on opposite sides of said region in the direction of said gradient, and means for applying radio frequency drive signals to said coils of opposite radio frequency phase.

* * * * *